(12) United States Patent
Khor et al.

(10) Patent No.: US 8,253,448 B1
(45) Date of Patent: Aug. 28, 2012

(54) TECHNIQUES FOR VARYING FREQUENCIES OF PERIODIC SIGNALS

(75) Inventors: Chuan Thim Khor, Teluk Intan (MY); Chuan Khye Chai, Bayan Baru (MY); Edwin Yew Fatt Kok, Sungai Ara (MY)

(73) Assignee: Altera Corporation, San Jose, CA (US)

( * ) Notice: Subject to any disclaimer, the term of this patent is extended or adjusted under 35 U.S.C. 154(b) by 85 days.

(21) Appl. No.: 12/839,096

(22) Filed: Jul. 19, 2010

(51) Int. Cl.
*H03B 19/00* (2006.01)
(52) U.S. Cl. ......... 327/113; 327/115; 327/117; 327/118
(58) Field of Classification Search .................. 327/113, 327/115, 118; 331/51
See application file for complete search history.

(56) References Cited

U.S. PATENT DOCUMENTS

2009/0296878 A1* 12/2009 Tsai ................................ 377/47
* cited by examiner

*Primary Examiner* — John Poos
(74) *Attorney, Agent, or Firm* — Steven J. Cahill (57) ABSTRACT

A circuit includes first and second frequency divider circuits and first storage circuits. Each of the first and the second frequency divider circuits receives periodic input signals and generates a periodic output signal having a frequency of one of the periodic input signals in a bypass mode. The periodic output signal of each of the first and the second frequency divider circuits has a fraction of a frequency of one of the periodic input signals in a frequency divider mode. Each of the first storage circuits stores an enable signal in response to the periodic output signal of one of the first frequency divider circuits. The enable signals stored in the first storage circuits enable the second frequency divider circuits in the frequency divider mode. The circuit may include second storage circuits storing enable signals that enable a subset of the first frequency divider circuits in the frequency divider mode.

20 Claims, 9 Drawing Sheets

TECHNIQUES FOR VARYING FREQUENCIES OF PERIODIC SIGNALS

BACKGROUND

The present invention relates to electronic circuits, and more particularly, to techniques for varying frequencies of periodic signals.

A high-speed digital data stream can be transmitted through a transmission line to a receiver without an accompanying clock signal. A phase-locked loop (PLL) circuit generates one or more clock signals from an approximate frequency reference signal, and then a clock and data recovery (CDR) circuit in the receiver phase-aligns the clock signals to the transitions in the data stream. The clock signals have different phases. The receiver uses the clock signals to sample bits in the data stream.

Some types of multi-channel CDR circuits have frequency divider circuits. The frequency divider circuits divide the frequencies of the clock signals generated by a phase-locked loop (PLL) circuit to generate frequency divided clock signals having lower frequencies than the clock signals generated by the PLL circuit. The frequency divided clock signals enable the receiver to support 2 different data rates of an incoming data stream without using an additional phase-locked loop.

Figure 1:
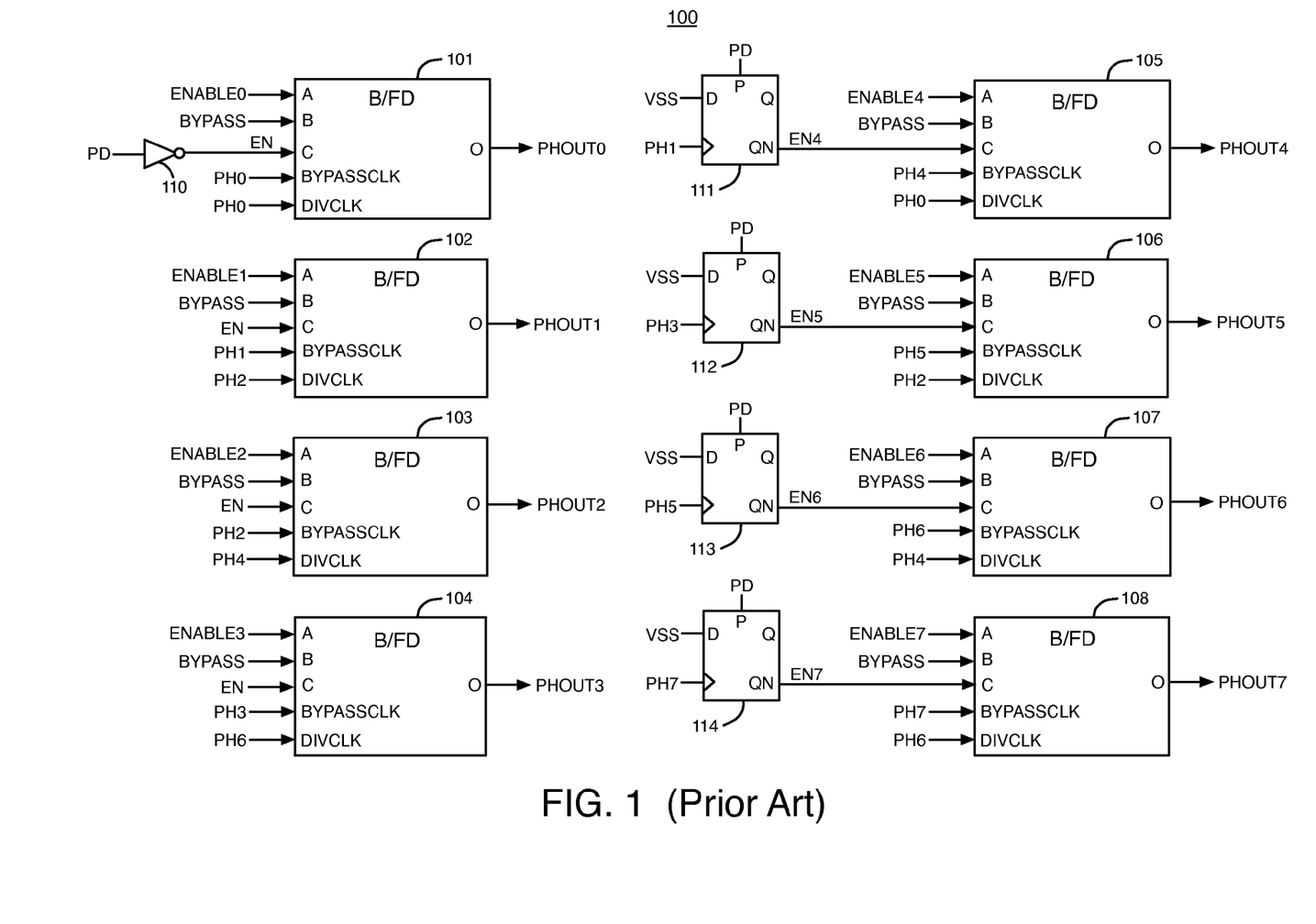
FIG. 1 illustrates an example of a prior art bypass/frequency divider system.

FIG. 1 illustrates an example of a prior art bypass/frequency divider system 100. System 100 includes 8 bypass/frequency divider (B/FD) circuits 101-108 that generate 8 periodic output clock signals PHOUT0, PHOUT1, PHOUT2, PHOUT3, PHOUT4, PHOUT5, PHOUT6, and PHOUT7 (i.e., PHOUT0-PHOUT7) at their respective O outputs based on 8 periodic input clock signals PH0, PH1, PH2, PH3, PH4, PH5, PH6, and PH7 (i.e., PH0-PH7), respectively.

B/FD circuits 101-108 receive enable signals ENABLE0, ENABLE1, ENABLE2, ENABLE3, ENABLE4, ENABLE5, ENABLE6, and ENABLE7 (i.e., ENABLE0-ENABLE7), respectively, at their A inputs. B/FD circuits 101-108 receive control signal BYPASS at their B inputs. B/FD circuits 101-104 receive enable signal EN at their C inputs. Inverter 110 inverts a power down (PD) signal to generate the enable signal EN.

System 100 also includes D flip-flop storage circuits 111-114. A ground signal VSS is provided to the D inputs of flip-flops 111-114. The PD signal is provided to the P (preset) inputs of flip-flops 111-114. The PH1, PH3, PH5, and PH7 input clock signals are provided to the clock inputs of flip-flops 111-114, respectively. Flip-flops 111-114 generate enable signals EN4-EN7, respectively, at their QN outputs. Enable signals EN4-EN7 are provided to the C inputs of B/FD circuits 105-108, respectively. Each of flip-flops 111-114 generates complementary digital signals at its Q and QN outputs.

B/FD circuits 101-108 receive clock signals PH0-PH7 at their BYPASSCLK inputs, respectively. B/FD circuits 101-108 receive clock signals PH0, PH2, PH4, PH6, PH0, PH2, PH4, and PH6 at their DIVCLK inputs, respectively.

Figure 2:
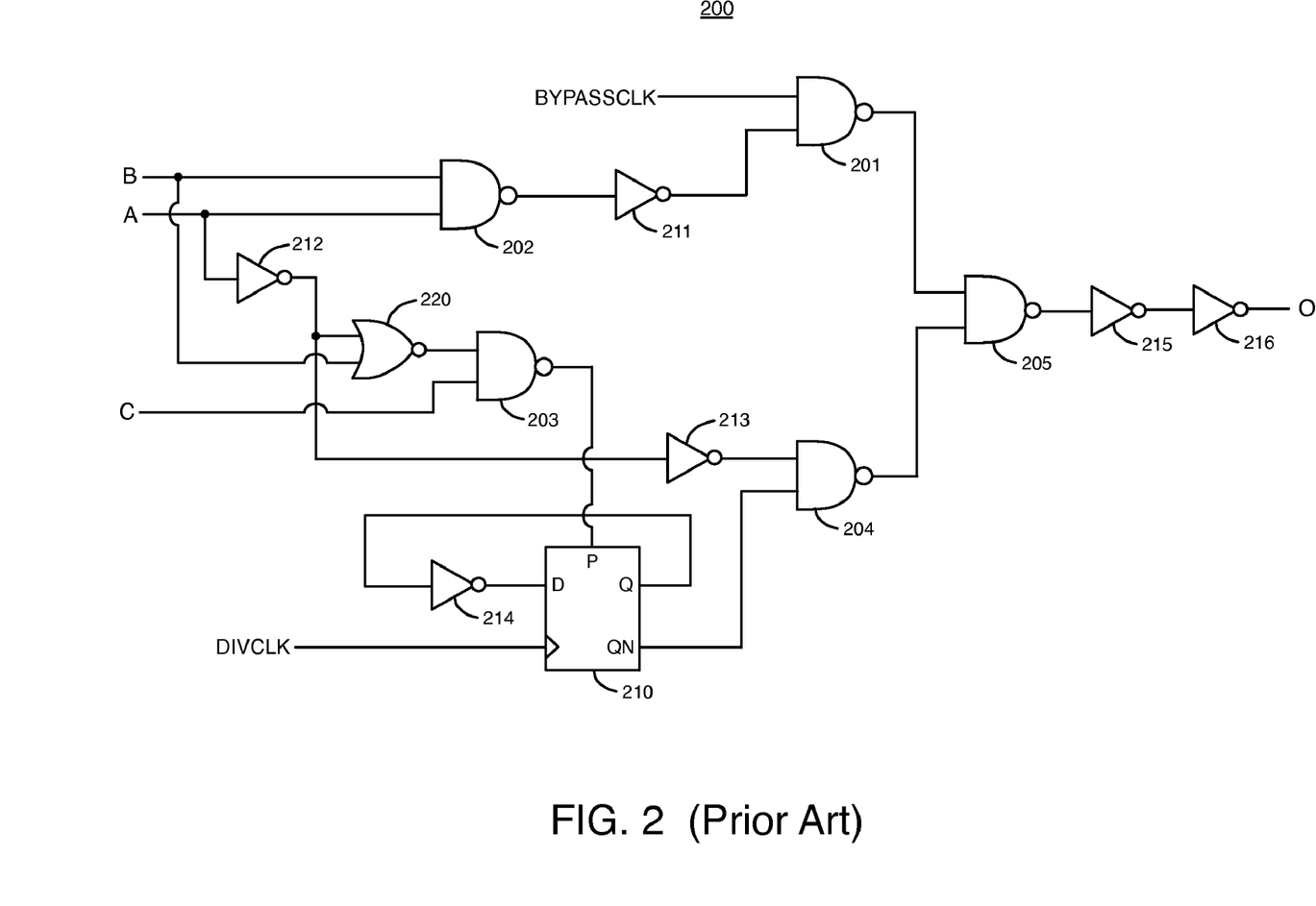
FIG. 2 illustrates each of the bypass/frequency divider (B/FD) circuits shown in FIG. 1.

FIG. 2 illustrates a prior art bypass/frequency divider (B/FD) circuit 200 that is in each of the B/FD circuits 101-108. B/FD circuit 200 includes NAND logic gates 201-205, inverters 211-216, D flip-flop 210, and NOR logic gate 220. When the signals at the A and B inputs of B/FD circuit 200 (i.e., BYPASS and one of ENABLE0-ENABLE7) are both in logic high states, and the signal at the C input of B/FD circuit 200 is in a logic low state (i.e., one of EN and EN4-EN7), B/FD circuit 200 is in bypass mode. In bypass mode, the output signal of inverter 211 is in a logic high state, and the output signal of NAND gate 203 is in a logic high state. The output of NAND gate 203 is coupled to the P input of flip-flop 210. A logic high state at the P input of flip-flop 210 holds the signal at the QN output of flip-flop 210 in a logic low state, causing the output signal of NAND gate 204 to be in a logic high state. As a result, B/FD circuit 200 passes the clock signal at the BYPASSCLK input to the O output in bypass mode without an inversion through NAND gates 201 and 205 and inverters 215-216. Flip-flop 210 generates complementary digital signals at its Q and QN outputs.

When the signals at the A and C inputs of B/FD circuit 200 are in logic high states, and the signal at the B input of B/FD circuit 200 is in a logic low state, B/FD circuit 200 is in frequency divider mode. In frequency divider mode, B/FD circuit 200 divides the frequency of the clock signal at its DIVCLK input by 2 to generate a frequency divided clock signal at its O output. In frequency divider mode, the output signal of NAND 203 is in a logic low state, which does not hold the signal at the QN output of flip-flop 210 in a preset logic state. Inverter 214 is coupled between the Q output and the D input of flip-flop 210. The DIVCLK input of circuit 200 is coupled to the clock input of flip-flop 210. In frequency divider mode, the signal at the QN output of flip-flop 210 toggles between logic high and logic low states at each rising edge of the clock signal received at the DIVCLK input of circuit 200. Thus, the clock signal at the QN output of flip-flop 210 has one-half the frequency of the clock signal at the DIVCLK input of circuit 200. The output signal of NAND gate 201 is in a logic high state, and the output signal of inverter 213 is in a logic high state. As a result, the clock signal at the QN output of flip-flop 210 passes to the O output of circuit 200 through NAND gates 204-205 and inverters 215-216 without an inversion in frequency divider mode.

Figure 3:
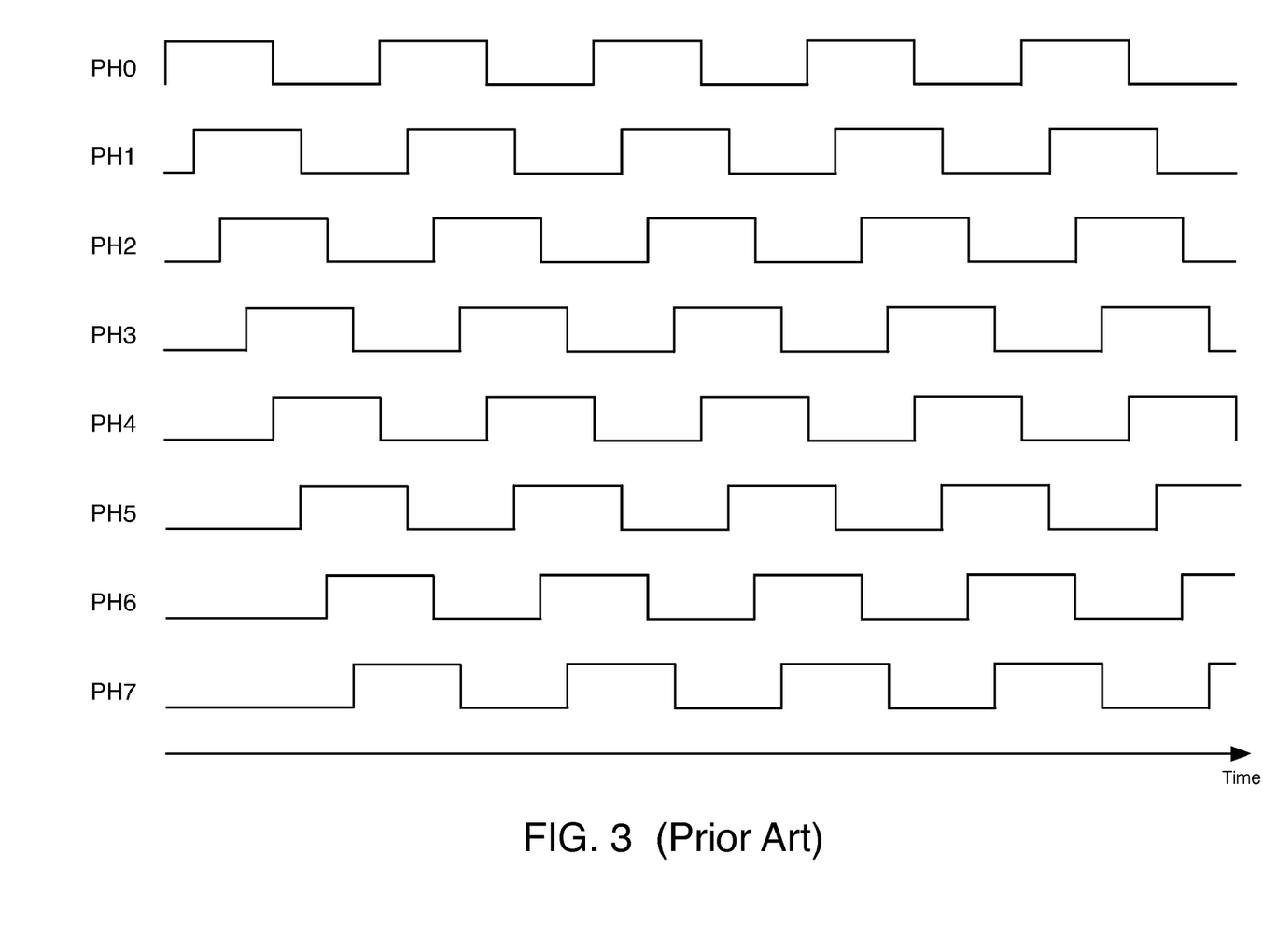
FIG. 3 is a timing diagram that shows waveforms of the input clock signals PH0-PH7 to the system shown in FIG. 1.

FIG. 3 is a timing diagram that shows waveforms of the input clock signals PH0-PH7 of system 100. FIG. 3 shows the relative phases of PH0-PH7. Input clock signals PH0-PH7 have relative phases of 0°, 45°, 90°, 135°, 180°, 225°, 270°, and 315°, respectively.

Figure 4:
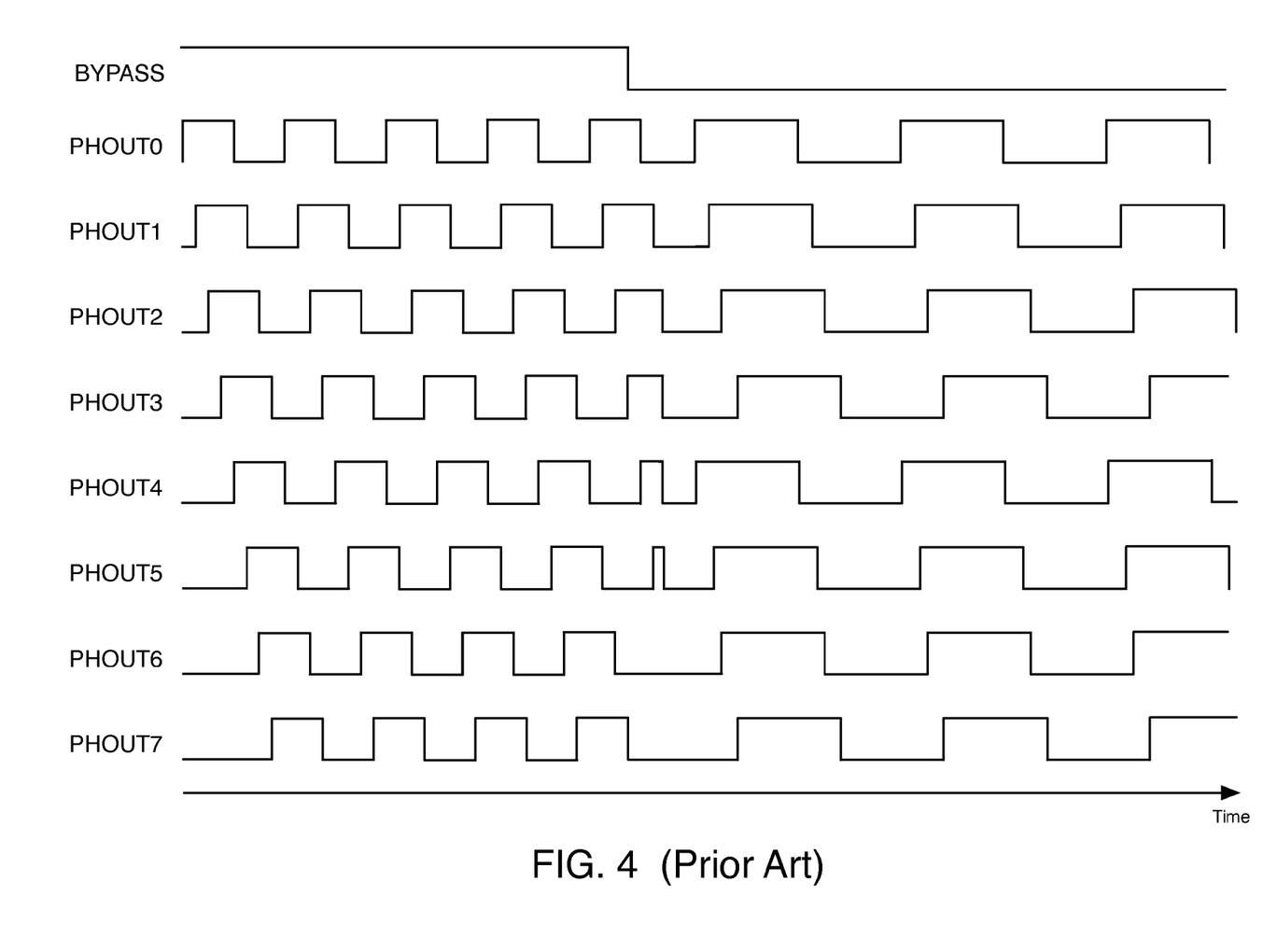
FIG. 4 is a timing diagram that shows waveforms of the BYPASS control signal and the output clock signals PHOUT0-PHOUT7 of the system shown in FIG. 1.

FIG. 4 is a timing diagram that shows waveforms of the BYPASS control signal and the output clock signals PHOUT0-PHOUT7 of system 100. In bypass mode, the BYPASS signal is in a logic high state, and the ENABLE0-ENABLE7 signals are all in logic high states. In bypass mode, B/FD circuits 101-108 pass input clock signals PH0-PH7 from their respective BYPASSCLK inputs to their respective O outputs as output clock signals PHOUT0-PHOUT7, respectively, as described above with respect to FIG. 2. Output clock signals PHOUT0-PHOUT7 have the same frequencies as input clock signals PH0-PH7, respectively, in bypass mode.

Each of the B/FD circuits 101-108 enters frequency divider mode after the BYPASS signal at its B input transitions from a logic high state to a logic low state and the signal at its C input is in a logic high state. The EN4-EN7 signals at the C inputs of B/FD circuits 105-108 transition to logic high states after the first rising edges of signals PH1, PH3, PH5, and PH7, respectively, that occur after the PD signal transitions to a logic low state. The ENABLE0-ENABLE7 signals remain in logic high states in frequency divider mode.

As shown in FIG. 4, the output clock signals PHOUT0-PHOUT7 of system 100 do not have the ideal relative phase offsets of 0°, 45°, 90°, 135°, 180°, 225°, 270°, and 315°, respectively, in frequency divider mode. Instead, after a falling edge in the BYPASS signal, the rising edges of the frequency divided clock signals PHOUT4-PHOUT7 are approximately aligned with the rising and falling edges of the frequency divided clock signals PHOUT0-PHOUT3, respectively, as shown in FIG. 4. In addition, the falling edge in the BYPASS signal causes glitches in output clock signals PHOUT2-PHOUT5 in FIG. 4.

BRIEF SUMMARY

According to some embodiments, a circuit includes first frequency divider circuits, second frequency divider circuits, and first storage circuits. Each of the first and the second frequency divider circuits receives periodic input signals and generates a periodic output signal having a frequency of one of the periodic input signals in a bypass mode. The periodic output signal of each of the first and the second frequency divider circuits has a fraction of a frequency of one of the periodic input signals in a frequency divider mode. Each of the first storage circuits stores an enable signal in response to the periodic output signal of one of the first frequency divider circuits. The enable signals stored in the first storage circuits enable the second frequency divider circuits in the frequency divider mode.

In some embodiments, the circuit includes second storage circuits. Each of the second storage circuits stores an enable signal in response to one of the periodic input signals provided to one of the first frequency divider circuits. The enable signals stored in the second storage circuits enable a subset of the first frequency divider circuits in the frequency divider mode.

Various objects, features, and advantages of the present invention will become apparent upon consideration of the following detailed description and the accompanying drawings.

DETAILED DESCRIPTION

Figure 5:
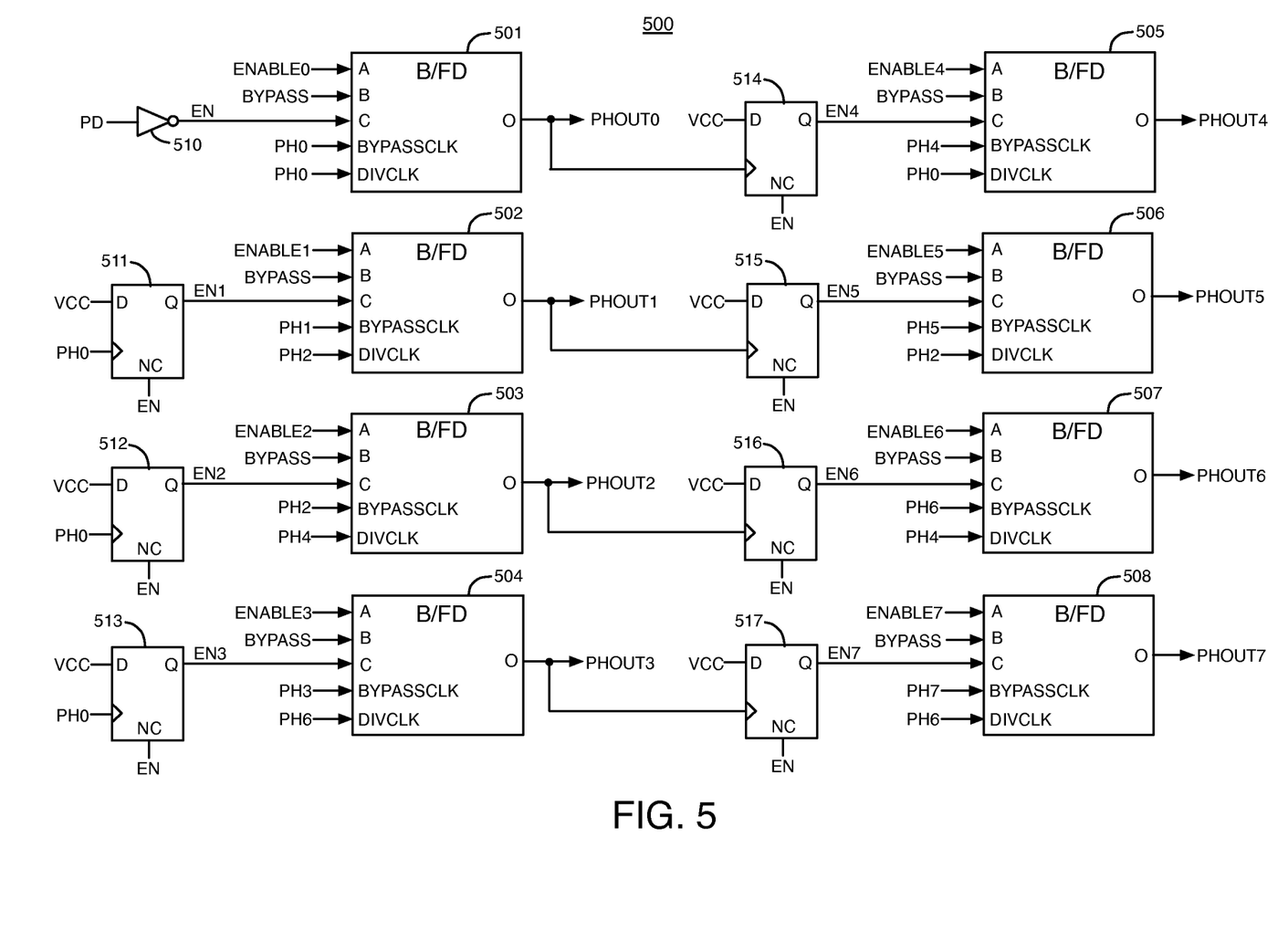
FIG. 5 illustrates an example of a bypass/frequency dividing system, according to an embodiment of the present invention.

FIG. 5 illustrates an example of a bypass/frequency divider (B/FD) system 500, according to an embodiment of the present invention. Bypass/frequency divider system 500 includes 8 bypass/frequency divider (B/FD) circuits 501-508, inverter 510, and 7 D flip-flop storage circuits 511-517. B/FD system 500 divides the frequencies of input clock signals by a division factor to generate the frequencies of output clock signals PHOUT0-PHOUT7. B/FD system 500 is dynamically reconfigurable, because B/FD system 500 has the capability to change its division factor on-the-fly from a bypass mode to a frequency divider mode (e.g., divide-by-2 mode) and from the frequency divider mode to the bypass mode.

In one exemplary embodiment of bypass/frequency divider system 500, each of the 8 B/FD circuits 501-508 includes a bypass/frequency divider (B/FD) circuit 200, as shown in FIG. 2. In this exemplary embodiment, bypass/frequency divider system 500 includes 8 B/FD circuits 200, and therefore, each of the B/FD circuits 501-508 includes NAND logic gates 201-205, inverters 211-216, D flip-flop 210, and NOR logic gate 220 coupled together as shown in FIG. 2. According to other embodiments of system 500, B/FD circuits 501-508 include other designs of frequency divider circuits that have the functionality described herein including a bypass mode.

Enable signals ENABLE0-ENABLE7 are provided to the A inputs of B/FD circuits 501-508, respectively. The BYPASS signal is provided to the B inputs of B/FD circuits 501-508. Input clock signals PH0-PH7 are provided to the BYPASSCLK inputs of B/FD circuits 501-508, respectively. Input clock signals PH0-PH7 have relative phase offsets of 0°, 45°, 90°, 135°, 180°, 225°, 270°, and 315°, respectively, as shown, for example, in FIG. 3. Each of the input clock signals PH0-PH7 has the same frequency. Input clock signals PH0, PH2, PH4, PH6, PH0, PH2, PH4, and PH6 are provided to the DIVCLK inputs of B/FD circuits 501-508, respectively.

A power down (PD) control signal is provided to an input of inverter 510. Inverter 510 inverts the PD signal to generate an enable signal EN. The enable signal EN is provided to the C input of B/FD circuit 501.

The enable signal EN is also provided to the NC (not clear) inputs of flip-flops 511-517. A high supply voltage VCC is provided to the D inputs of flip-flops 511-517. Input clock signal PH0 is provided to the clock inputs of flip-flops 511-513. Flip-flops 511-513 store enable signals EN1-EN3 at their Q outputs, respectively. Enable signals EN1-EN3 are provided to the C inputs of B/FD circuits 502-504, respectively.

B/FD circuits 501-508 generate output clock signals PHOUT0-PHOUT7, respectively, at their O outputs. The output clock signals PHOUT0-PHOUT3 of B/FD circuits 501-504 are provided to the clock inputs of flip-flops 514-517, respectively. Flip-flops 514-517 store enable signals EN4-EN7 at their Q outputs, respectively. Enable signals EN4-EN7 are provided to the C inputs of B/FD circuits 505-508, respectively.

Figure 6:
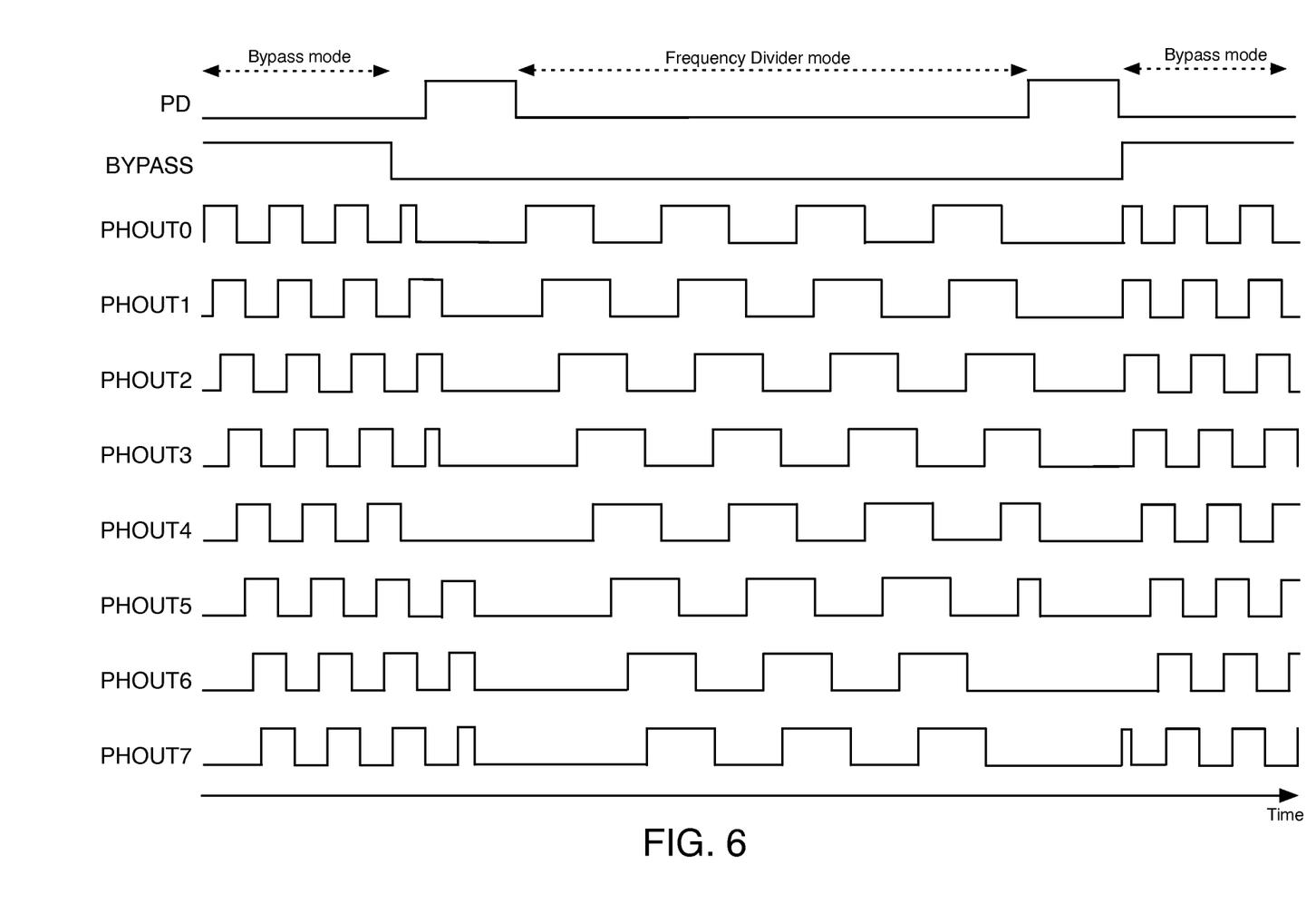
FIG. 6 is a timing diagram that shows exemplary waveforms of the PD control signal, the BYPASS control signal, and the output clock signals PHOUT0-PHOUT7 of the bypass/frequency divider circuits shown in FIG. 5, according to an embodiment of the present invention.

FIG. 6 is a timing diagram that shows exemplary waveforms of the PD control signal, the BYPASS control signal, and the output clock signals PHOUT0-PHOUT7 of the bypass/frequency divider (B/FD) circuits 501-508 shown in FIG. 5, according to an embodiment of the present invention. An example of the operation of bypass/frequency divider system 500 is now described with respect to the exemplary waveforms shown in FIG. 6. In the discussion of the operation of system 500 below, it is assumed that each of the B/FD circuits 501-508 includes a B/FD circuit 200.

The 8 enable signals ENABLE0-ENABLE7 transition to logic high states to enable the operation of B/FD circuits 501-508, respectively. All of the ENABLE0-ENABLE7 signals remain in logic high states during the operation of B/FD circuits 501-508, including during the bypass and frequency divider modes.

After the first rising edge of input clock signal PH0 that occurs while the EN signal is in a logic high state, flip-flops 511-513 store logic high states in the EN1-EN3 signals at their Q outputs, respectively, based on the supply voltage VCC at their D inputs. After the first rising edges of output clock signals PHOUT0-PHOUT3, flip-flops 514-517 store logic high states in the EN4-EN7 signals at their Q outputs, respectively, based on the supply voltage VCC at their D inputs.

When the ENABLE0-ENABLE7 and BYPASS signals are all in logic high states, each of the B/FD circuits 501-508 is in bypass mode. In bypass mode, B/FD circuits 501-508 pass input clock signals PH0-PH7 from their BYPASSCLK inputs to their O outputs as output clock signals PHOUT0-PHOUT7, respectively, as described, for example, with respect to FIG. 2. In bypass mode, the frequencies of output clock signals PHOUT0-PHOUT7 equal the frequencies of input clock signals PH0-PH7, respectively. In bypass mode, B/FD circuits 501-508 delay input clock signals PH0-PH7 to generate output clock signals PHOUT0-PHOUT7, respectively. In bypass mode, output clock signals PHOUT0-PHOUT7 have relative phase offsets of 0°, 45°, 90°, 135°, 180°, 225°, 270°, and 315°, respectively, as shown in FIG. 6.

The bypass mode of each of the B/FD circuits 501-508 ends after the BYPASS signal transitions from a logic high state to a logic low state. Subsequently, a logic high pulse is generated in the PD signal, as shown in FIG. 6. Each of the B/FD circuits 501-508 then transitions to frequency divider mode. The PD signal may be asynchronous with respect to input clock signals PH0-PH7. If the PD signal is asynchronous with respect to input clock signals PH0-PH7, glitches may be generated in one or more of the output clock signals PHOUT0-PHOUT7 after bypass mode, as shown in FIG. 6.

Inverter 510 generates a logic low pulse in the EN signal in response to the logic high pulse in the PD signal. Because the EN signal is provided to the NC (not clear) inputs of flip-flops 511-517, flip-flops 511-517 cause the EN1-EN7 signals at their Q outputs, respectively, to transition from logic high states to logic low states in response to the falling edge in the EN signal. Output clock signals PHOUT0-PHOUT7 remain in logic low states (e.g., for one or more periods of PH0-PH7) in response to the BYPASS, EN, and EN1-EN7 signals being in logic low states. B/FD circuits 501-508 do not generate pulses in output clock signals PHOUT0-PHOUT7 while the EN and EN1-EN7 signals, respectively, are in logic low states and the BYPASS signal is in a logic low state. Referring to FIG. 2, the input signals of NAND gate 205 both remain in logic high states while the input signals at the B and C inputs of circuit 200 are both in logic low states.

At the end of the logic low pulse in the EN signal, a rising edge occurs in the EN signal, and B/FD circuit 501 begins to generate rising and falling edges in output clock signal PHOUT0 in frequency divider mode. After the rising edge in the EN signal, flip-flops 511-513 generate rising edges in the EN1-EN3 signals at the C inputs of B/FD circuits 502-504, respectively, in response to the next rising edge in input clock signal PH0. In response to the rising edges in signals EN1-EN3 and the BYPASS signal being in a logic low state, B/FD circuits 502-504 generate rising and falling edges in output clock signals PHOUT1-PHOUT3, respectively, in frequency divider mode.

Flip-flops 514-517 generate rising edges in the EN4-EN7 signals at the C inputs of B/FD circuits 505-508 in response to the first rising edges in output clock signals PHOUT0-PHOUT3, respectively, that occur after the rising edge in the EN signal. In response to the rising edges in the EN4-EN7 signals and the BYPASS signal being in a logic low state, B/FD circuits 505-508 generate rising and falling edges in output clock signals PHOUT4-PHOUT7, respectively, in frequency divider mode. The EN1-EN7 signals remain in logic high states until the next falling edge in the EN signal.

When the BYPASS and PD signals are in logic low states, and the EN, EN1-EN7, and ENABLE0-ENABLE7 signals are all in logic high states after a logic high pulse in the PD signal, each of the B/FD circuits 501-508 is in frequency divider mode. In frequency divider mode, B/FD circuits 501-508 divide the frequencies of input clock signals PH0, PH2, PH4, PH6, PH0, PH2, PH4, and PH6 by 2 to generate the frequencies of output clock signals PHOUT0-PHOUT7, respectively, as described above, for example, with respect to FIG. 2. Thus, the frequencies of output clock signals PHOUT0-PHOUT7 are one-half the frequencies of input clock signals PH0, PH2, PH4, and PH6 in frequency divider mode. In other embodiments, B/FD circuits 501-508 divide the frequencies of input clock signals PH0, PH2, PH4, PH6, PH0, PH2, PH4, and PH6 by any integer or non-integer division factor (e.g., 3, 4, 5, 6, etc.) to generate the frequencies of output clock signals PHOUT0-PHOUT7, respectively, in frequency divider mode.

Flip-flops 511-513 are clocked by clock signal PH0. Flip-flops 511-513 generate rising edges in enable signals EN1-EN3, respectively, in response to a rising edge in signal PH0 before the next rising edge in signal PH2 occurring after that same rising edge in signal PH0. Flip-flops 511-513 prevent B/FD circuits 502-504 from generating rising and falling edges in output clock signals PHOUT1-PHOUT3, respectively, in frequency divider mode until B/FD circuit 501 begins to generate rising and falling edges in output clock signal PHOUT0. The phases of the output clock signals PHOUT0-PHOUT7 of system 500 are spaced apart in phase by 45 degree phase intervals in frequency divider mode.

Because output clock signals PHOUT0-PHOUT3 are provided to the clock inputs of flip-flops 514-517, B/FD circuits 505-508 do not generate rising and falling edges in output clock signals PHOUT4-PHOUT7 in the frequency divider mode until after the first rising edges occur in output clock signals PHOUT0-PHOUT3, respectively, in frequency divider mode. Thus, the first rising edges in output clock signals PHOUT4-PHOUT7 in frequency divider mode occur after the first rising edges of output clock signals PHOUT0-PHOUT3 in frequency divider mode, as shown in FIG. 6. B/FD system 500 generates output clock signals PHOUT0-PHOUT7 that have relative phase offsets of 0°, 45°, 90°, 135°, 180°, 225°, 270°, and 315°, respectively, in frequency divider mode, as shown in FIG. 6.

The frequency divider mode of B/FD system 500 ends at the beginning of the next logic high pulse in the PD signal. The next logic high pulse in the PD signal generates the next logic low pulse in the EN signal. Flip-flops 511-517 clear the EN1-EN7 signals, respectively, to logic low states in response to the falling edge in the EN signal, as described above. The output clock signals PHOUT0-PHOUT7 are maintained in logic low states during the transition from frequency divider mode to bypass mode. After the next rising edge in the EN signal and a rising edge in the BYPASS signal, B/FD system 500 reenters bypass mode, and flip-flops 511-517 generate rising edges in the EN1-EN7 signals, as described above. B/FD circuits 501-508 pass input clock signals PH0-PH7 from their BYPASSCLK inputs to their O outputs as output clock signals PHOUT0-PHOUT7, respectively, in bypass mode in response to a logic high state in the BYPASS signal and logic high states in the ENABLE0-ENABLE7 signals.

Although a bypass/frequency divider system 500 that generates 8 clock signals PHOUT0-PHOUT7 having 8 different phases in response to 8 input clock signals PH0-PH7 is described herein, bypass/frequency divider systems having techniques of the present invention can generate any number of output clock signals in response to a corresponding number of input clock signals (e.g., 4, 6, 12, 16, 18, etc.).

Figure 7:
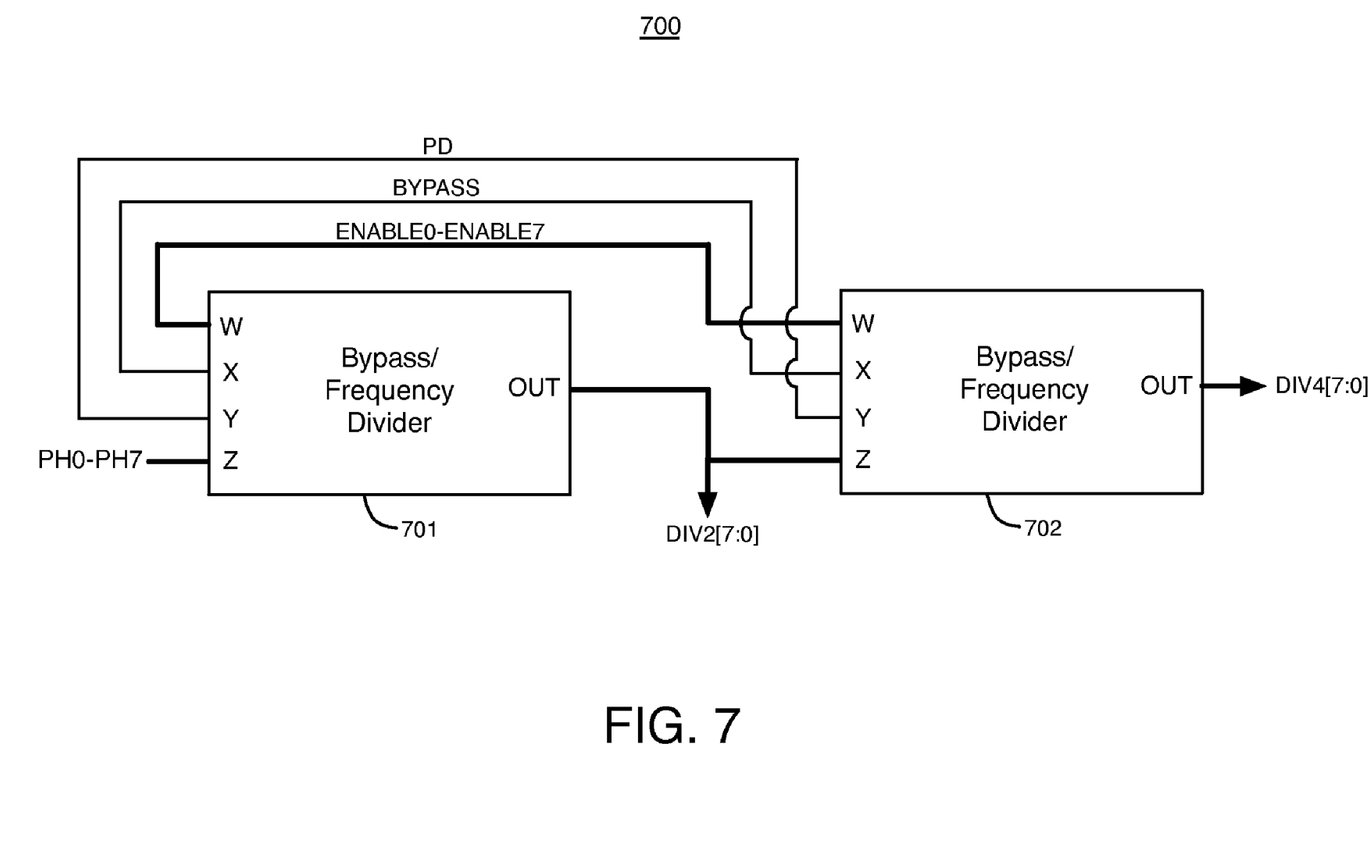
FIG. 7 illustrates an example of a system having two bypass/frequency divider (B/FD) systems that are coupled together in series, according to another embodiment of the present invention.

According to additional embodiments, multiple bypass/frequency divider (B/FD) systems 500 can be coupled together in series to generate frequency divided clock signals having frequencies that are $\frac{1}{2}^N$ times the frequencies of the input clock signals, where N equals 1, 2, 3, 4, etc. FIG. 7 illustrates an example of a system 700 having two bypass/frequency divider (B/FD) systems 701-702 that are coupled together in series, according to another embodiment of the present invention. In an embodiment, a first B/FD system 500 as shown in FIG. 5 is in B/FD system 701, and a second B/FD system 500 as shown in FIG. 5 is in B/FD system 702.

The PD signal is provided to the Y inputs of B/FD systems 701-702. The BYPASS signal is provided to the X inputs of B/FD systems 701-702. The ENABLE0-ENABLE7 signals are provided to the W inputs of B/FD systems 701-702. 8 input clock signals PH0-PH7 are provided to the Z inputs of B/FD system 701.

B/FD system 701 generates 8 output clock signals DIV2[7:0] at its outputs OUT in response to input clock signals PH0-PH7. In B/FD system 701, output clock signals DIV2[7:0] represent output clock signals PHOUT0-PHOUT7, respectively, in FIG. 5.

Clock signals DIV2[7:0] are provided to the Z inputs of B/FD system 702. B/FD system 702 generates 8 output clock signals DIV4[7:0] at its outputs OUT in response to input clock signals DIV2[7:0]. In B/FD system 702, input clock signals DIV2[7:0] represent input clock signals PH0-PH7 in FIG. 5, and output clock signals DIV4[7:0] represent output clock signals PHOUT0-PHOUT7 in FIG. 5.

When both of B/FD systems 701-702 are in frequency divider mode as described above with respect to FIG. 5, B/FD system 701 causes the frequencies of clock signals DIV2[7:0] to be one-half the frequencies of input clock signals PH0-PH7, and B/FD system 702 causes the frequencies of clock signals DIV4[7:0] to be one-half the frequencies of clock signals DIV2[7:0] and one-fourth the frequencies of clock signals PH0-PH7.

Figure 8:
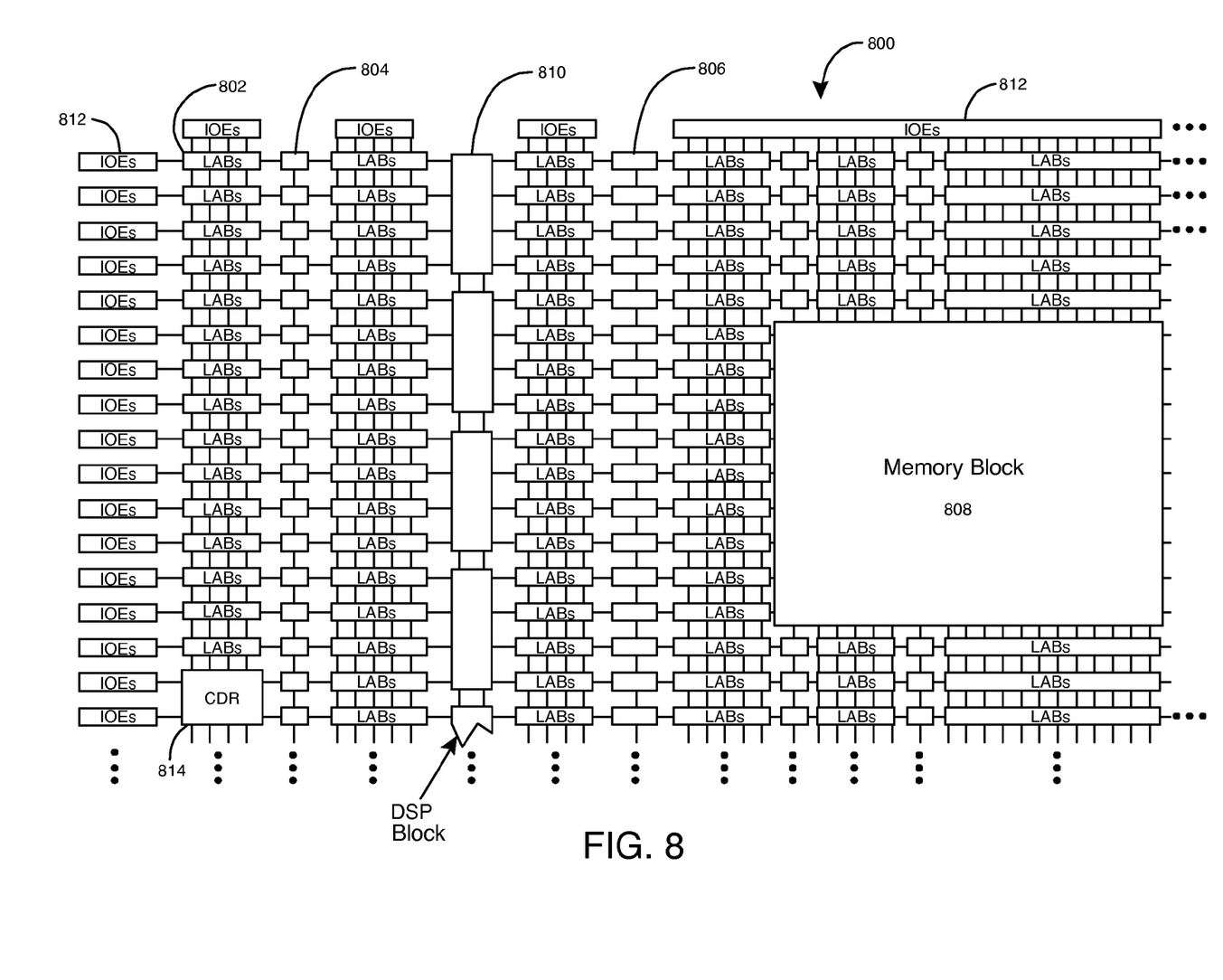
FIG. 8 is a simplified partial block diagram of a field programmable gate array (FPGA) that can include aspects of the present invention.

FIG. 8 is a simplified partial block diagram of a field programmable gate array (FPGA) 800 that can include aspects of the present invention. FPGA 800 is merely one example of an integrated circuit that can include features of the present invention. It should be understood that embodiments of the present invention can be made in numerous types of integrated circuits such as field programmable gate arrays (FPGAs), programmable logic devices (PLDs), complex programmable logic devices (CPLDs), programmable logic arrays (PLAs), application specific integrated circuits (ASICs), memory integrated circuits, central processing units, microprocessors, analog integrated circuits, etc.

FPGA 800 includes a two-dimensional array of programmable logic array blocks (or LABs) 802 that are interconnected by a network of column and row interconnect conductors of varying length and speed. LABs 802 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 also includes a distributed memory structure including random access memory (RAM) blocks of varying sizes provided throughout the array. The RAM blocks include, for example, blocks 804, blocks 806, and block 808. These memory blocks can also include shift registers and first-in-first-out (FIFO) buffers.

FPGA 800 further includes digital signal processing (DSP) blocks 810 that can implement, for example, multipliers with add or subtract features. Input/output elements (IOEs) 812 located, in this example, around the periphery of the chip, support numerous single-ended and differential input/output standards. IOEs 812 include input and output buffers that are coupled to pads of the integrated circuit. The pads are external terminals of the FPGA die that can be used to route, for example, input signals, output signals, and supply voltages between the FPGA and one or more external devices. FPGA 800 also has a clock and data recovery (CDR) circuit 814 that includes a bypass/frequency divider system, such as bypass/frequency divider system 500. In another embodiment, a bypass/frequency divider system 500 is used in a memory interface. It is to be understood that FPGA 800 is described herein for illustrative purposes only and that the present invention can be implemented in many different types of integrated circuits.

Figure 9:
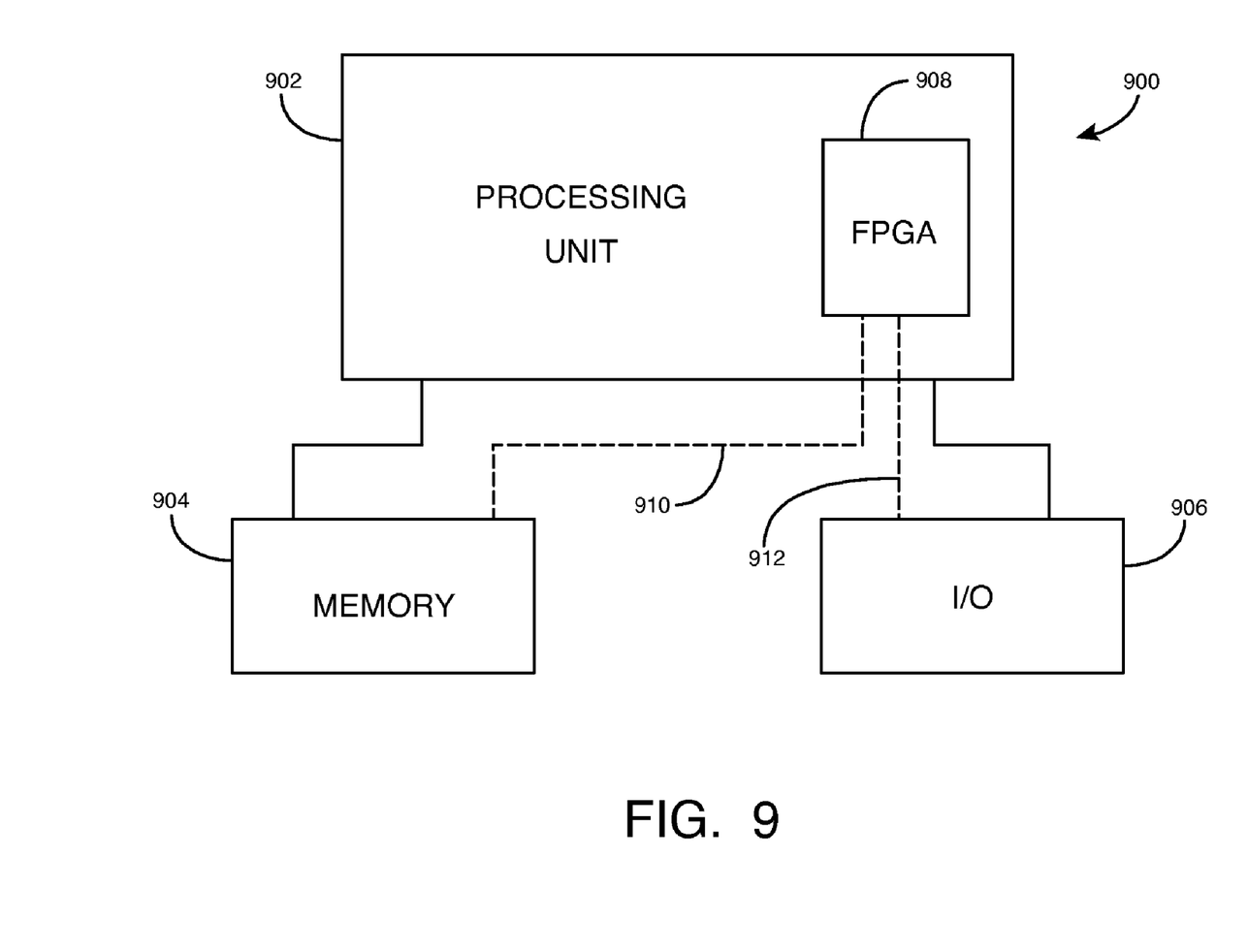
FIG. 9 shows a block diagram of an exemplary digital system that can embody techniques of the present invention.

The present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904, and an input/output (I/O) unit 906 interconnected together by one or more buses. According to this exemplary embodiment, an FPGA 908 is embedded in processing unit 902. FPGA 908 can serve many different purposes within the system of FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904, receive and transmit data via I/O unit 906, or other similar functions. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor that can be reprogrammed as needed to handle a particular computing task. Alternatively, FPGA 908 can itself include an embedded microprocessor. Memory unit 904 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A circuit comprising:
   first frequency divider circuits and second frequency divider circuits, wherein each of the first and the second frequency divider circuits receives periodic input signals and generates a periodic output signal having a frequency of one of the periodic input signals in a bypass mode, and wherein the periodic output signal of each of the first and the second frequency divider circuits has a fraction of a frequency of one of the periodic input signals in a frequency divider mode; and
   first storage circuits, wherein each of the first storage circuits stores an enable signal in response to the periodic output signal of one of the first frequency divider circuits, and wherein the enable signals stored in the first storage circuits enable the second frequency divider circuits in the frequency divider mode.

2. The circuit of claim 1 further comprising:
   second storage circuits, wherein each of the second storage circuits stores an enable signal in response to one of the periodic input signals provided to one of the first frequency divider circuits, and wherein the enable signals stored in the second storage circuits enable a subset of the first frequency divider circuits in the frequency divider mode.

3. The circuit of claim 2 wherein the enable signals stored in the first and the second storage circuits are reset to default values in response to a control signal that is asserted during a transition between the bypass mode and the frequency divider mode.

4. The circuit of claim 2 wherein each of the first and the second storage circuits comprises a flip-flop circuit.

5. The circuit of claim 1 further comprising:
   third frequency divider circuits and fourth frequency divider circuits, wherein each of the third and the fourth frequency divider circuits generates a periodic output signal in response to at least one of the periodic output signals of the first and the second frequency divider circuits, wherein the periodic output signal of each of the third and the fourth frequency divider circuits equals a frequency of one of the periodic output signals of the first and the second frequency divider circuits in a bypass mode, and wherein the periodic output signal of each of the third and the fourth frequency divider circuits has a fraction of a frequency of one of the periodic output signals of the first and the second frequency divider circuits in a frequency divider mode; and
   second storage circuits, wherein each of the second storage circuits stores an enable signal in response to the periodic output signal of one of the third frequency divider circuits, and wherein the enable signals stored in the second storage circuits enable the fourth frequency divider circuits in the frequency divider mode.

6. The circuit of claim 5 further comprising:
   third storage circuits, wherein each of the third storage circuits stores an enable signal in response to one of the periodic output signals of the first and the second frequency divider circuits, and wherein the enable signals stored in the third storage circuits enable a subset of the third frequency divider circuits in the frequency divider mode.

7. The circuit of claim 1 wherein the circuit comprises at least three of the first frequency divider circuits and at least three of the second frequency divider circuits.

8. The circuit of claim 1 wherein the circuit is in a programmable logic integrated circuit.

9. The circuit of claim 1 wherein each of the first and the second frequency divider circuits switches between the bypass mode and the frequency divider mode in response to a control signal.

10. A circuit comprising:
    first frequency divider circuits operable to generate first periodic output signals in response to first periodic input signals in bypass mode, wherein the first frequency divider circuits are operable to generate the first periodic output signals in frequency divider mode by dividing frequencies of second periodic input signals;
    first storage circuits operable to store first enable signals in response to the first periodic output signals; and
    second frequency divider circuits operable to generate second periodic output signals in response to third periodic input signals in bypass mode, wherein the second frequency divider circuits are operable to be enabled by the first enable signals to generate the second periodic output signals in frequency divider mode by dividing frequencies of fourth periodic input signals.

11. The circuit of claim 10 wherein the fourth periodic input signals comprise the same periodic signals as the second periodic input signals.

12. The circuit of claim 10 further comprising:
    second storage circuits operable to store second enable signals that enable a subset of the first frequency divider circuits to function in frequency divider mode.

13. The circuit of claim 12 wherein each of the second storage circuits is clocked by one of the first periodic input signals.

14. The circuit of claim 10 further comprising:
    third frequency divider circuits operable to generate third periodic output signals in response to the first periodic output signals in bypass mode, wherein the third frequency divider circuits are operable to generate the third periodic output signals in frequency divider mode by dividing the frequencies of a subset of the first and the second periodic output signals;
    second storage circuits operable to store second enable signals in response to the third periodic output signals; and
    fourth frequency divider circuits operable to generate fourth periodic output signals in response to the second periodic output signals in bypass mode, wherein the fourth frequency divider circuits are operable to be enabled by the second enable signals to generate the fourth periodic output signals in frequency divider mode by dividing the frequencies of a subset of the first and the second periodic output signals.

15. The circuit of claim 14 further comprising:
    third storage circuits operable to store third enable signals that enable a subset of the third frequency divider circuits to function in frequency divider mode.

16. The circuit of claim 10 wherein the circuit is in an integrated circuit.

17. A method comprising:
generating first periodic output signals having frequencies of first periodic input signals in bypass mode;
generating the first periodic output signals by dividing frequencies of second periodic input signals in frequency divider mode;
storing first enable signals in response to the first periodic output signals;
generating second periodic output signals having frequencies of third periodic input signals in bypass mode; and
generating the second periodic output signals by dividing frequencies of fourth periodic input signals in response to the first enable signals in frequency divider mode.

18. The method of claim 17 further comprising:
storing second enable signals in response to one of the first periodic input signals, wherein generating the first periodic output signals by dividing frequencies of second periodic input signals in frequency divider mode further comprises generating a subset of the first periodic output signals in response to the second enable signals in the frequency divider mode.

19. The method of claim 17 further comprising:
generating third periodic output signals in response to the first periodic output signals in bypass mode;
generating the third periodic output signals by dividing frequencies of a subset of the first and the second periodic output signals in frequency divider mode;
storing second enable signals in response to the third periodic output signals;
generating fourth periodic output signals in response to the second periodic output signals in bypass mode; and
generating the fourth periodic output signals by dividing frequencies of a subset of the first and the second periodic output signals in response to the second enable signals in frequency divider mode.

20. The method of claim 17 wherein the fourth periodic input signals and the second periodic input signals are the same set of periodic signals.

* * * * *